(12) United States Patent
Chang

(10) Patent No.: US 8,466,459 B2
(45) Date of Patent: Jun. 18, 2013

(54) ORGANIC LIGHT EMITTING DISPLAY DEVICE AND METHOD OF MANUFACTURING THE SAME

(75) Inventor: Seung-Wook Chang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 93 days.

(21) Appl. No.: 13/009,137

(22) Filed: Jan. 19, 2011

(65) Prior Publication Data

US 2011/0175073 A1    Jul. 21, 2011

(30) Foreign Application Priority Data

Jan. 19, 2010    (KR) ..................... 10-2010-0004751

(51) Int. Cl.
*H01L 51/52*    (2006.01)

(52) U.S. Cl.
USPC ................. 257/40; 257/59; 257/72; 438/22; 349/63

(58) Field of Classification Search
USPC ................. 257/40, 59, 72; 313/503; 349/39
See application file for complete search history.

(56) References Cited

U.S. PATENT DOCUMENTS

| | | | |
|---|---|---|---|
| 5,951,350 A | 9/1999 | Aoki et al. | |
| 2003/0048398 A1* | 3/2003 | Maeda et al. | 349/113 |
| 2006/0068520 A1 | 3/2006 | Song et al. | |
| 2006/0125381 A1 | 6/2006 | Oh | |
| 2006/0177767 A1* | 8/2006 | Lee | 430/270.1 |
| 2006/0183036 A1 | 8/2006 | Sakashita et al. | |
| 2007/0092981 A1* | 4/2007 | Jung et al. | 438/30 |
| 2007/0096636 A1* | 5/2007 | Park et al. | 313/503 |
| 2007/0114521 A1 | 5/2007 | Hayashi et al. | |
| 2008/0138657 A1 | 6/2008 | Lee et al. | |
| 2008/0180024 A1 | 7/2008 | Kwon | |
| 2008/0218064 A1 | 9/2008 | Cho et al. | |
| 2010/0053513 A1 | 3/2010 | Rho et al. | |

FOREIGN PATENT DOCUMENTS

| | | |
|---|---|---|
| KR | 0491477 | 5/2005 |
| KR | 20050077204 A | 8/2005 |
| KR | 10-2006-0020030 A | 3/2006 |
| KR | 20060042750 A | 5/2006 |
| KR | 20060067057 | 6/2006 |
| KR | 10-2006-0092108 A | 8/2006 |
| KR | 0707601 B1 | 4/2007 |
| KR | 10-2007-0050722 A | 5/2007 |
| KR | 0796618 | 1/2008 |
| KR | 20080054597 A | 6/2008 |
| KR | 10-0646936 B | 11/2009 |

OTHER PUBLICATIONS

Korean Office Action issued by KIPO on Apr. 25, 2011, corresponding to Korean Paten Application No. 10-2010-0004751, "Request for Entry of the Accompanying Office Action" attached herewith.
Korean Office action issued by KIPO on Nov. 30, 2011, corresponding to KR 10-2010-0004751 and Request for Entry attached herewith.

* cited by examiner

*Primary Examiner* — Minh-Loan T Tran
*Assistant Examiner* — Fazli Erdem
(74) *Attorney, Agent, or Firm* — Robert E. Bushnell, Esq.

(57) ABSTRACT

An organic light emitting display device having a uniform thin film in a sub-pixel region, and a method of manufacturing the organic light emitting display device. The organic light emitting display device includes a substrate, a pixel electrode disposed on the substrate, and a pixel define layer disposed on the substrate and exposing the pixel electrode. The surface of the pixel electrode is saw toothed or rough in shape.

15 Claims, 3 Drawing Sheets

CONVENTIONAL ART

ORGANIC LIGHT EMITTING DISPLAY DEVICE AND METHOD OF MANUFACTURING THE SAME

CROSS-REFERENCE TO RELATED PATENT APPLICATION

This application claims the benefit of Korean Patent Application No. 10-2010-0004751, filed on Jan. 19, 2010, in the Korean Intellectual Property Office, the disclosure of which is incorporated herein in its entirety by reference.

BACKGROUND OF THE INVENTION

1. Field of the Invention

The general inventive concept relates to an organic light emitting display device and a method of manufacturing the same.

2. Description of the Related Art

Generally, flat display devices may be largely classified into an emissive type and a non-emissive type. Examples of an emissive type flat display device include a flat cathode ray tube, a plasma display panel, an electro luminescent device, and a light emitting diode. Examples of a non-emissive type flat display device include a liquid crystal display. Electro luminescent devices have a wide viewing angle, excellent contrast, and a quick response speed, and thus have come into the spotlight as next generation display devices. The electro luminescent devices may be classified into inorganic electro luminescent devices and organic electro luminescent devices based on a material used to form an emission layer.

Organic electro luminescent devices are self-luminous display devices that emit light by electrically exciting a fluorescent organic compound. The organic electro luminescent devices are driven at a low voltage, are thin, have a wide viewing angle and a quick response speed, and thus may be used as next generation display devices.

The above information disclosed in this Related Art section is only for enhancement of understanding of the background of the invention and therefore it may contain information that does not form the prior art that is already known to a person of ordinary skill in the art

SUMMARY OF THE INVENTION

The present invention provides an organic light emitting display device having a uniform thin film in a sub-pixel region.

According to an aspect of the present invention, there is provided an organic light emitting display device including: a substrate; a pixel electrode disposed on the substrate; and a pixel define layer disposed on the substrate and exposing the pixel electrode, wherein the surface of the pixel electrode is rough.

The surface of the pixel define layer may be rough.

The surface of the pixel electrode may be rougher than the surface of the pixel define layer.

The roughness of the side of the pixel define layer and roughness of the top of the pixel define layer may be different from each other.

The side of the pixel define layer may be rougher than the top of the pixel define layer.

The surface of the pixel electrode may be rougher than the side of the pixel define layer.

The surface of the pixel electrode may be rougher than the top of the pixel define layer.

The pixel define layer may be formed of a material having a molecular weight from about 1000 to about 2000.

According to another aspect of the present invention, there is provided an organic light emitting display device including: a substrate; a pixel electrode disposed on the substrate; and a pixel define layer formed on the substrate and having an opening that exposes the pixel electrode, wherein the surface of the pixel electrode is rougher than the side of the opening.

The side of the opening may be rougher than the top of the pixel define layer.

The top of the pixel define layer may be smooth.

According to another aspect of the present invention, there is provided an organic light emitting display device including: a substrate; a pixel circuit unit formed on the substrate; an insulation layer covering the pixel circuit unit; a pixel electrode formed on the insulation layer and electrically connected to the pixel circuit unit; a pixel define layer formed on the insulation layer and having an opening for exposing the surface of the pixel electrode; an intermediate layer formed on the opening to cover the pixel electrode; and a counter electrode formed to cover the pixel define layer and the intermediate layer, wherein the surface of the pixel electrode is rougher than the side of the opening of the pixel define layer.

The top surface of the pixel electrode may be rougher than the side of the opening of the pixel define layer.

The roughness of the side of the opening and the roughness of the top of the pixel define layer may be different from each other.

The side of the opening may be rougher than the top of the pixel define layer.

According to another aspect of the present invention, there is provided a method of manufacturing an organic light emitting display device, the method including: preparing a substrate; forming a pixel electrode on the substrate; forming the surface of the pixel electrode to be rough; forming a pixel define layer having an opening for exposing the surface of the pixel electrode; forming the side of the opening to be less rough than the surface of the pixel electrode; and forming an intermediate layer on the pixel electrode.

The forming of the intermediate layer may include: coating an organic matter on the pixel define layer and the pixel electrode; and forming the intermediate layer using the organic matter left on the pixel electrode by rotating the substrate.

The forming of the intermediate layer may further include: removing the organic matter coated on the pixel define layer by rotating the substrate; keeping the organic matter coated on the pixel electrode by rotating the substrate; and forming the intermediate layer by plasticizing the organic matter kept on the pixel electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
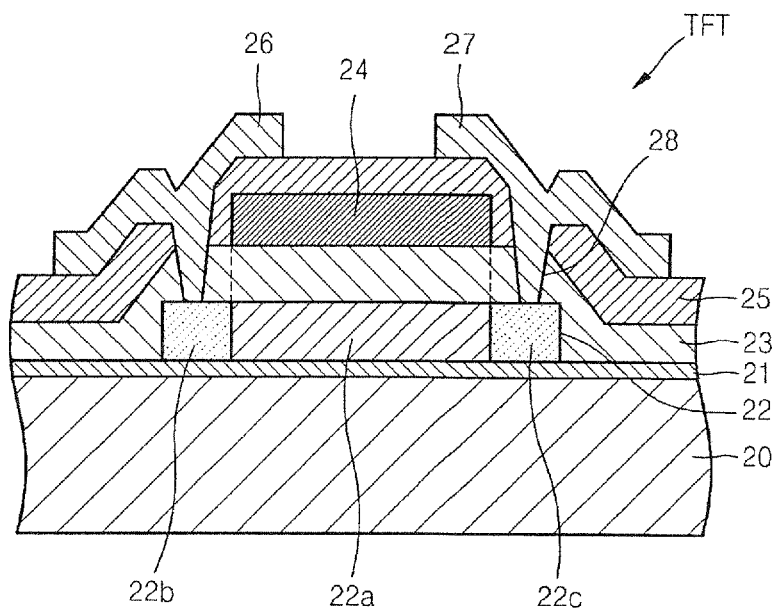
FIG. 1 is a cross-sectional view of a thin film transistor according to an embodiment of the present invention.

Hereinafter, the present invention will be described more fully with reference to the accompanying drawings, in which exemplary embodiments of the invention are shown.

As those skilled in the art would realize, the described embodiments may be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

A conventional organic electro luminescent devices includes an anode, a cathode, and an emission layer formed of an organic matter and disposed between the anode and the cathode. When an anode voltage and a cathode voltage are respectively applied to the anode and the cathode, a hole is transported from the anode to an emission layer through a hole transport layer (HTL), and an electron is transported from the cathode to the emission layer through an electron transport layer (ETL). The hole and the electron are combined in the emission layer, and thus an exciton is generated.

When the exciton is changed from an excited state to a ground state, fluorescent molecules of the emission layer emit light, thereby forming an image. A full color type organic electro luminescent device may realize full color by using pixels emitting red, green, and blue lights.

Conventional organic electro luminescent devices may include a pixel define layer at each end of the anode. A predetermined opening is formed on the pixel define layer, and then the emission layer and the cathode are sequentially formed on the top of the anode exposed through the predetermined opening.

FIG. 1 is a cross-sectional view of a thin film transistor TFT according to an embodiment of the present invention. Here, the thin film transistor TFT is a pixel circuit unit.

Referring to FIG. 1, the thin film transistor TFT may be disposed on a substrate 20. The substrate 20 may be formed of glass or plastic.

A buffer layer 21 is formed on the substrate 20, an active layer 22 formed of a semiconductor material is formed on the buffer layer 21, and a gate insulation layer 23 is formed to cover the active layer 22. A gate electrode 24 is formed on the gate insulation layer 23, and an interlayer insulation layer 25 is formed to cover the gate electrode 24, and source and drain electrodes 26 and 27 are formed on the interlayer insulation layer 25. The source and drain electrodes 26 and 27 respectively contact source and drain regions 22b and 22c of the active layer 22 through a contact hole 28 formed in the gate insulation layer 23 and the interlayer insulation layer 25.

The active layer 22 formed on the substrate 20 may be formed of one of an inorganic semiconductor material and an organic semiconductor material. The source and drain regions 22b and 22c are doped with an n-type or p-type dopant, and a channel region 22a is formed to connect the source and drain regions 22b and 22c.

Examples of the inorganic semiconductor material include CdS, GaS, ZnS, CdSe, CaSe, ZnSe, CdTe, SiC, and Si.

Examples of the organic semiconductor material may include polythiophene and derivatives thereof, polyparaphenylenevinylene and derivatives thereof, polyparaphenylene and derivatives thereof, polyfluorene and derivates thereof, polythiophenevinylene and derivatives thereof, polythiophene-hetero-ring aromatic copolymer and derivatives thereof as polymers, and may include oligoacene of pentacene, tetracene, or naphthalene and derivatives thereof, oligothiophene of alpha-6-thiophene or alpha-5-thiophene and derivatives thereof, phthalocyanine containing or not containing a metal and derivatives thereof, pyromelitic dianhydride or pyromelitic diimide and derivatives thereof, and perylenetetracarboxylate dianhydride or perylenetetracarboxylic diimide and derivatives thereof as small molecules.

The active layer 22 is covered by the gate insulation layer 23, and the gate electrode 24 is formed on the gate insulation layer 23. The gate electrode 24 may be formed of a conductive metal, such as molybdenum tungsten (MoW), aluminum (Al), chromium (Cr), or an alloy of Al and Copper (Cu), but a material for forming the gate electrode 24 is not limited thereto, and may be a conductive material, such as a conductive polymer. The gate electrode 24 is formed to cover a region corresponding to the gate region 22a of the active layer 22.

Figure 2:
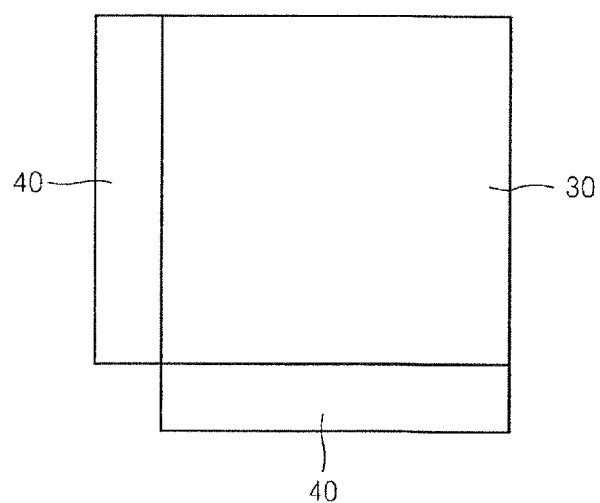
FIG. 2 is a plan view of an organic light emitting display device according to an embodiment of the present invention.

FIG. 2 is a plan view of an organic light emitting display device according to an embodiment of the present invention.

Referring to FIG. 2, the organic light emitting display device includes a pixel region 30 and circuit regions 40 on edges of the pixel region 30. The pixel region 30 includes a plurality of pixels, and each pixel includes an emitter for emitting light to realize an image.

According to an embodiment of the present invention, the emitter includes a plurality of sub-pixels each including an organic electro luminescent device. When the organic light emitting display device realizes full color, sub-pixels emitting red, green, and blue lights are arranged in a pattern, such as a line, a mosaic, or a lattice, so as to form a pixel. However, the organic light emitting display device may realize a mono color.

The circuit region 40 controls an image signal, or the like input to the pixel region 30.

In the organic light emitting display device, at least one thin film transistor may be installed in each of the pixel region 30 and the circuit region 40.

Examples of the thin film transistor installed in the pixel region include a switching thin film transistor for controlling an operation of the emitter according to a signal of a gate line by transmitting a data signal to the emitter, and a pixel unit thin film transistor such as a driving thin film transistor for supplying a current to the organic electro luminescent device according to a data signal. Also, examples of the thin film transistor installed in the circuit region 40 include a circuit unit thin film transistor for realizing a predetermined circuit.

The number and arrangement of the thin film transistors may vary according to characteristics and driving methods of the organic light emitting display device.

Figure 3:
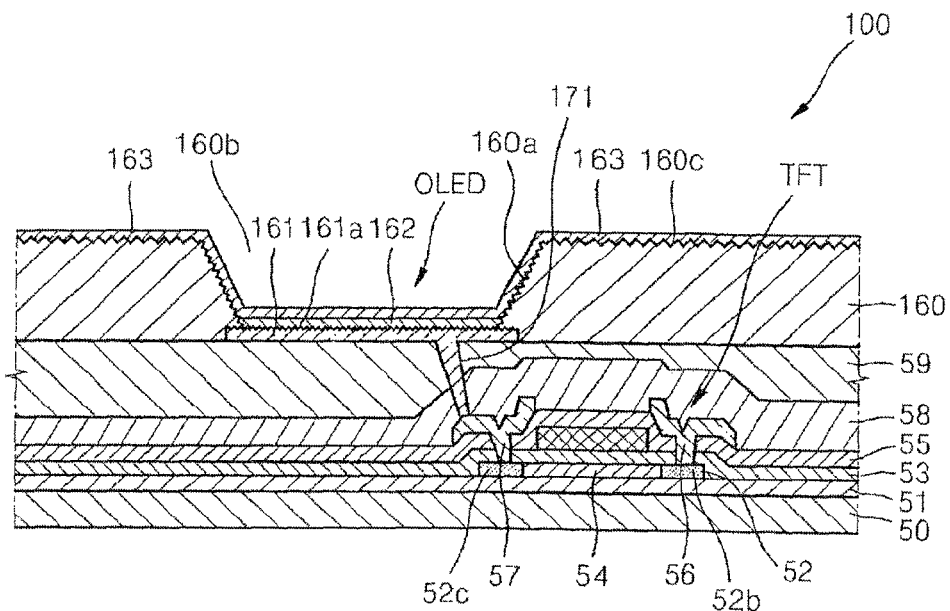
FIG. 3 is a cross-sectional view of a sub-pixel of an organic light emitting display device according to an embodiment of the present invention.
Figure 4:
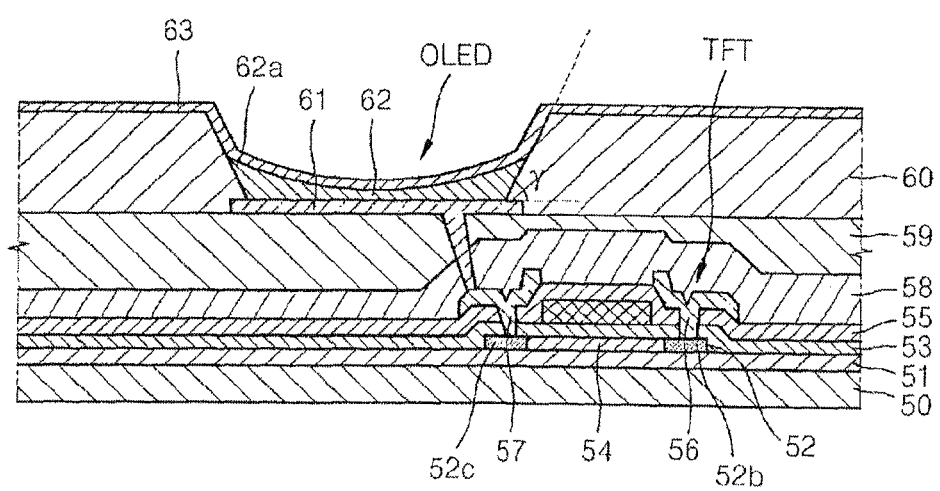
FIG. 4 is a cross-sectional view of a sub-pixel of a conventional organic light emitting display device.

FIG. 3 is a cross-sectional view of a sub-pixel of an organic light emitting display device 100 according to an embodiment of the present invention, and FIG. 4 is a cross-sectional view of a sub-pixel of a conventional organic light emitting display device.

Referring to FIG. 3, a buffer layer 51 may be disposed on a substrate 50 formed of glass or plastic, and a thin film transistor TFT and an organic electro luminescent device OLED may be disposed on the buffer layer 51.

An active layer 52 having a predetermined pattern is disposed on the buffer layer 51. A gate insulation layer 53 is disposed on the active layer 52, and a gate electrode 54 is formed on a predetermined region of the gate insulation layer 53. The gate electrode 54 is connected to a gate line (not shown) for applying an on/off signal to the thin film transistor TFT. An interlayer insulation layer 55 is formed on the gate electrode 54, and source and drain electrodes 56 and 57 are formed to respectively contact source and drain regions 52b and 52c of the active layer 52 through a contact hole 171. An insulation layer 58 is formed on the source and drain electrodes 56 and 57. The insulation layer 58 may be a passivation layer formed of $SiO_2$ or SiNx. A planarization layer 59 formed of an organic matter, such as acryl, polyimide, or benzocyclobutene (BCB), may be formed on the insulation layer 58.

A pixel electrode 161 functioning as an anode of the organic electro luminescent device OLED is formed on the planarization layer 59, and a pixel define layer 160 is formed to cover the pixel electrode 161 by using an organic matter. An opening 160b is formed on the pixel define layer 160, and then an intermediate layer 162 is formed on the top of the pixel define layer 160 and on the pixel electrode 161 that is exposed through the opening 160b. Here, the intermediate layer 162 includes an emission layer not shown. However, the structure of the organic light emitting display device 100 is not limited thereto, and may vary.

According to the organic light emitting display device 100, the opening 160b of the pixel define layer 160 may be formed to expose a top 161a of the pixel electrode 161. A structure, a function, and an effect of the pixel define layer 160 will be described in detail later.

The organic electro luminescent device displays a predetermined image by emitting red, green, or blue light according to a current flow, and includes the pixel electrode 161 connected to the drain electrode 57 of the thin film transistor TFT and receiving a positive voltage from the drain electrode 57, a counter electrode 163 covering the entire pixel electrode 161 and supplying a negative voltage to the pixel electrode 161, and the intermediate layer 162 disposed between the pixel electrode 161 and the counter electrode 163.

The pixel electrode 161 and the counter electrode 163 are insulated from each other by the intermediate layer 162, and the intermediate layer 162 emits light as the pixel electrode 161 and the counter electrode 163 apply voltages having different polarity to the intermediate layer 162.

Here, the intermediate layer 162 may be a small molecular organic layer or a polymer organic layer. When the small molecular organic layer is used, the intermediate layer 162 may have a single or multiple structure of a hole injection layer (HIL), a hole transport layer (HTL), an emission layer (EML), an electron transport layer (ETL), and an electron injection layer (EIL), and may be formed of copper phthalocyanine (CuPc), N,N'-di(naphthalene-1-yl)-N,N'-diphenyl-benzidine (NPB), tris-8-hydroxyquinoline aluminum (Alq3) or the like. The small molecular organic layer is formed by using a vacuum deposition method.

When the polymer organic layer is used, the intermediate layer 162 may include an HTL and an EML. Here, the HTL may be formed of poly(3,4-ethylene dioxythiophene) (PEDOT) and the EML may be formed of a poly-phenylenevinylene (PPV)-based or polyfluorene-based polymer organic matter. The polymer organic layer may be formed by using a screen printing or inkjet printing method.

However, examples of the intermediate layer 162 are not limited thereto.

The intermediate layer 162 may be formed by using a spin coating method. In detail, an organic matter is coated on the pixel electrode 161 and the pixel define layer 160. Then, the substrate 50 is rotated. The organic matter coated on the pixel define layer 160 is removed and only the organic matter coated on the pixel electrode 161 is left according to a rotating amount of the substrate 50. Next, the intermediate layer 162 may be formed by plasticizing the organic matter coated on the pixel electrode 161.

The pixel electrode 161 functions as an anode, and the counter electrode 163 functions as a cathode. Alternatively, the pixel electrode 161 may function as a cathode and the counter electrode 163 may function as an anode.

The pixel electrode 161 may be transparent or reflective. When the pixel electrode 161 is transparent, the pixel electrode 161 may be formed of ITO, IZO, ZnO, or $In_2O_3$, and when reflective, the pixel electrode 161 may be formed by forming a reflective layer using Ag, Mg, Al, Pt, Pd, Au, Ni, Nd, Ir, Cr, or any mixture thereof, and then foaming a ITO, IZO, ZnO, or $In_2O_3$ layer on the reflective layer.

Meanwhile, the counter electrode 163 may also be transparent or reflective. When the counter electrode 163 is transparent, the counter electrode 163 functions as a cathode, and thus may be formed by depositing a metal having a low work function, such as Li, Ca, LiF/Ca, LiF/Al, Al, Ag, Mg, or any compound thereof, on the intermediate layer 162, and then forming a subsidiary electrode layer or a bus electrode line by using a material, such as ITO, IZO, ZnO, or $In_2O_3$, for forming a transparent electrode. Alternatively, when the counter electrode 163 is reflective, the counter electrode 163 may be formed by depositing Li, Ca, LiF/Ca, LiF/Al, Al, Ag, Mg, or any compound thereof on the intermediate layer 162.

A pixel define layer of an organic light emitting display device, according to an embodiment of the present invention, will now be described in detail.

The pixel define layer is a patterned insulation layer that accurately defines a light emitting region, while manufacturing the organic light emitting display device. Referring back to FIG. 3, the pixel define layer 160 of the organic light emitting display device 100 may be formed of a material having a molecular weight of about 1000 to about 2000. Examples of a material for forming the pixel define layer 160 include tert-butyloxycarbonyl (t-Boc) protected C-4-hydroxyphenyl-calix[4] resorcinarenes.

Referring to FIG. 4 illustrating the conventional organic light emitting display device, a pixel define layer 60 is formed to have a predetermined angle γ with respect to the substrate 50 in order to remove a shadow effect generated while depositing the pixel define layer 60. Here, the pixel define layer 60 is generally formed to incline with respect to the substrate 50 while having a straight shape.

Meanwhile, a solution method is used to foam a thin layer by coating a solution on a substrate and then evaporating a solvent by rotating the substrate, or the like, and is used to form an intermediate layer 62. The thickness of the intermediate layer 62 formed by using the solution method is tens of nm, and the thickness of the pixel define layer 60 is hundreds to thousands of nm, and thus the pixel define layer 60 is like a barrier to the intermediate layer 62 while forming the intermediate layer 62. Accordingly, the solvent goes up the pixel define layer 60 according to surface tension before being evaporated, and thus as shown in FIG. 4, each end 62a of the intermediate layer 62 sharply protrudes along the pixel define layer 60. Accordingly, uniformity of the intermediate layer 62 is deteriorated. Specifically, when the solvent is forcibly evaporated by rotating the substrate 50, such as in a spin coating method, the solvent backflows at the pixel define layer 60, and thus the uniformity of the intermediate layer 62 is remarkably deteriorated. Moreover, the uniformity of the intermediate layer 62 formed accordingly is difficult to control, and thus process deviation increases, and a light emitting surface of an organic electro luminescent device OLED is not even.

Accordingly, an organic light emitting display device according to an embodiment of the present invention may include a surface of a pixel define layer that is rougher than a surface of a pixel electrode.

This will now be described in detail.

In order to prevent each end of an intermediate layer from protruding according to surface tension, and to increase uniformity of the intermediate layer disposed on a pixel electrode, a thickness of a pixel define layer is decreased so as to decrease a tilt angle of the pixel define layer. However, considering interference of an adjacent pixel, decreasing the thickness of the pixel define layer may decrease the resolution of an image, and thus there is a limit to decreasing the tilt angle.

Also, when the intermediate layer is formed by using a forcible rotating method, such as a spin coating method, or a forcible moving method, such as a slit coating method, sides of the pixel define layer act as a large barrier, and thus backflow phenomenon is generated, and thus the edges of the intermediate layer becomes thick.

Accordingly, as shown in FIG. 3, the top 161a of the pixel electrode 161 may be rough or saw toothed in shape. Also, a side 160a of the opening 160b and a top of 160c of the pixel define layer 160 may also be rough or saw toothed in shape. In detail, the top 161a of the pixel electrode 161 may be rougher than the side 160a and the top 160c. Here, the roughness of the side 160a and the roughness of the top 160c may be different. In other words, the side 160a may be rougher than the top 160c or visa versa. Even when the roughness of the side 160a and the roughness of the top 160c are different from each other, the top 161a may still be rougher than the side 160a and the top 160c.

As such, when the top 161a of the pixel electrode 161 is rougher than the side 160a of the opening 160b and the substrate 50 is rotated according to the spin coating or slit coating method, a backflow phenomenon may be reduced according to a roughness difference between the top 161a and the side 160a when the organic matter coated on the pixel electrode 161 flows back to the pixel electrode 161 after contacting the side 160a of the opening 160b. Accordingly, the thickness of the edges of the intermediate layer 162 may not be increased. Thus, the uniformity of the intermediate layer 162 on the pixel electrode 161 is increased, thereby decreasing luminance non-uniformity of the sub-pixel.

Figure 5:
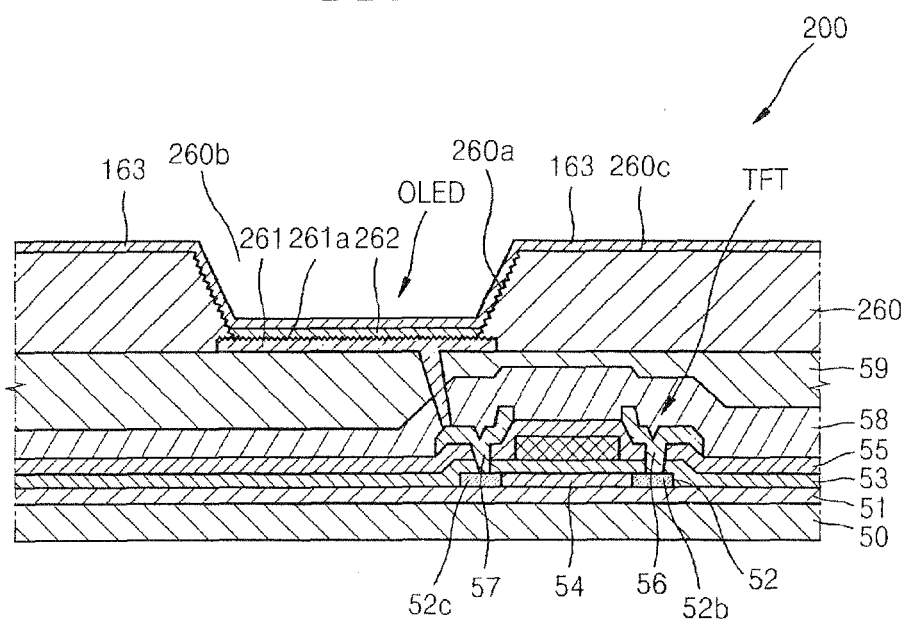
FIG. 5 is a cross-sectional view of a sub-pixel of an organic light emitting display device according to another embodiment of the present invention.

FIG. 5 is a cross-sectional view of a sub-pixel of an organic light emitting display device 200 according to another embodiment of the present invention.

Referring to FIG. 5, the organic light emitting display device 200 is identical to the organic light emitting display device 100 in that a surface 261a of a pixel electrode 261 is rougher than a side 260a of an opening 260b of a pixel define layer 260, but is different in that a top 260c of the pixel define layer 260 is smooth. By smoothing the top 260c of the pixel define layer 260, an organic matter coated on the top 260c of the pixel define layer 260 is easily removed when an intermediate layer 262 is formed by using a spin coating method.

According to the embodiments of the present invention, uniformity of a thin film in a sub-pixel region may be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device comprising:
   a substrate;
   a pixel electrode disposed on the substrate; and
   a pixel define layer disposed on the substrate and exposing the pixel electrode, a surface of the pixel define layer being a saw toothed in shape,
   wherein a surface of the pixel electrode is saw toothed in shape, and the surface of the pixel electrode includes larger saw teeth than the surface of the pixel define layer and is rougher.

2. The organic light emitting display device of claim 1, wherein the saw tooth shape of the side of the pixel define layer and saw toothed shape of the top of the pixel define layer are different from each other.

3. The organic light emitting display device of claim 2, wherein the side of the pixel define layer includes larger saw teeth than the top of the pixel define layer and is rougher.

4. The organic light emitting display device of claim 3, wherein the surface of the pixel electrode includes larger saw teeth than the side of the pixel define layer and is rougher.

5. The organic light emitting display device of claim 3, wherein the surface of the pixel electrode includes larger saw teeth than the top of the pixel define layer and is rougher.

6. The organic light emitting display device of claim 1, wherein the pixel define layer is formed of a material having a molecular weight from about 1000 to about 2000.

7. An organic light emitting display device comprising:
   a substrate;
   a pixel electrode disposed on the substrate; and
   a pixel define layer formed on the substrate and having an opening that exposes the pixel electrode, a side of the opening including saw teeth,
   wherein the surface of the pixel electrode includes saw teeth and is rougher than the side of the opening.

8. The organic light emitting display device of claim 7, wherein the side of the opening is rougher than the top of the pixel define layer.

9. The organic light emitting display device of claim 7, wherein the top of the pixel define layer is smooth.

10. An organic light emitting display device comprising:
    a substrate;
    a pixel circuit unit formed on the substrate;
    an insulation layer covering the pixel circuit unit;
    a pixel electrode formed on the insulation layer and electrically connected to the pixel circuit unit;

a pixel define layer formed on the insulation layer and having an opening for exposing the surface of the pixel electrode, a side of the opening including saw teeth;

an intermediate layer formed on the opening to cover the pixel electrode; and a counter electrode formed to cover the pixel define layer and the intermediate layer, wherein the surface of the pixel electrode includes saw teeth and is rougher than the side of the opening of the pixel define layer.

11. The organic light emitting display device of claim 10, wherein the saw teeth of the side of the opening and the saw teeth of the top of the pixel define layer are different from each other.

12. The organic light emitting display device of claim 11, wherein the side of the opening includes larger saw teeth than the saw teeth of the pixel define layer and is rougher than the top of the pixel define layer.

13. A method of manufacturing an organic light emitting display device, the method comprising:

preparing a substrate;

forming a pixel electrode on the substrate;

forming the surface of the pixel electrode having a saw toothed shape;

forming a pixel define layer having an opening for exposing the surface of the pixel electrode;

forming the side of the opening to have a saw toothed shape, the side of the opening being less rough than the surface of the pixel electrode; and forming an intermediate layer on the pixel electrode.

14. The method of claim 13, wherein the forming of the intermediate layer comprises:

coating an organic matter on the pixel define layer and the pixel electrode; and forming the intermediate layer using the organic matter left on the pixel electrode by rotating the substrate.

15. The method of claim 14, wherein the forming of the intermediate layer further comprises:

removing the organic matter coated on the pixel define layer by rotating the substrate;

keeping the organic matter coated on the pixel electrode by rotating the substrate; and forming the intermediate layer by plasticizing the organic matter kept on the pixel electrode.

* * * * *